(12) United States Patent
Ueyama et al.

(10) Patent No.: US 8,077,477 B2
(45) Date of Patent: Dec. 13, 2011

(54) ELECTRONIC COMPONENT AND CIRCUIT BOARD

(75) Inventors: Takatoshi Ueyama, Osaka (JP); Toshiyuki Kajimura, Osaka (JP)

(73) Assignee: Panasonic Corporation, Osaka (JP)

( * ) Notice: Subject to any disclaimer, the term of this patent is extended or adjusted under 35 U.S.C. 154(b) by 455 days.

(21) Appl. No.: 12/333,524

(22) Filed: Dec. 12, 2008

(65) Prior Publication Data

US 2009/0154120 A1    Jun. 18, 2009

(30) Foreign Application Priority Data

Dec. 13, 2007    (JP) ................. 2007-321866

(51) Int. Cl.
*H05K 7/00* (2006.01)
(52) U.S. Cl. ....................................... 361/782
(58) Field of Classification Search .......... 361/782–784, 361/772–775
See application file for complete search history.

(56) References Cited

U.S. PATENT DOCUMENTS

| | | | |
|---|---|---|---|
| 6,380,621 B1 * | 4/2002 | Ando et al. | 257/707 |
| 6,897,565 B2 * | 5/2005 | Pflughaupt et al. | 257/777 |
| 7,268,426 B2 * | 9/2007 | Warner et al. | 257/707 |
| 2006/0197625 A1 | 9/2006 | Kashiwakura | |
| 2007/0085628 A1 | 4/2007 | Takubo et al. | |

FOREIGN PATENT DOCUMENTS

| | | |
|---|---|---|
| JP | 09-135140 | 5/1997 |
| JP | 2004-320556 | 11/2004 |

* cited by examiner

*Primary Examiner* — Javaid Nasri
(74) *Attorney, Agent, or Firm* — McDermott Will & Emery LLP

(57) ABSTRACT

An electronic component, including: a first terminal group including a plurality of functional terminals provided along a first side of the electronic component; a second terminal group including a plurality of functional terminals provided along a second side of the electronic component opposing the first side; and an element that is connected to at least one of the functional terminals of the first terminal group and to at least one of the functional terminals of the second terminal group. The first terminal group includes a first dummy terminal in at least one space between the functional terminals of the first terminal group; the second terminal group includes a second dummy terminal in at least one space between the functional terminals of the second terminal group; and the first and second dummy terminals are not connected to any element inside the electronic component.

30 Claims, 12 Drawing Sheets

12
US 8,077,477 B2
1
ELECTRONIC COMPONENT AND CIRCUIT BOARD

CROSS REFERENCE TO RELATED APPLICATION

This application claims priority under 35 U.S.C. §119 on Patent Application No. 2007-321866 filed in Japan on Dec. 13, 2007, the entire contents of which are hereby incorporated by reference.

BACKGROUND

The present disclosure relates to an electronic component and a circuit board including an electronic component thereon.

In recent years, a high-speed interface such as HDMI (High-Definition Multimedia Interface) has been used. Since a high-speed interface signal used with such an interface contains a high-frequency signal, impedance matching needs to be done along the transmission path when transmitting the high-speed interface signal. For example, Japanese Laid-Open Patent Publication No. 9-135140 discloses a composite electronic component including an impedance matching circuit. Japanese Laid-Open Patent Publication No. 2004-320556 discloses a passive component including a circuit responsible for impedance matching between the component and a semiconductor component.

SUMMARY

The impedance matching between an electronic component and a wire for transmitting a signal input to or output from the electronic component may be improved.

An electronic component in one illustrative embodiment of the present invention includes: a first terminal group including a plurality of functional terminals provided along a first side of the electronic component; a second terminal group including a plurality of functional terminals provided along a second side of the electronic component opposing the first side; and an element that is connected to at least one of the functional terminals of the first terminal group and to at least one of the functional terminals of the second terminal group. The first terminal group includes a first dummy terminal in at least one space between the functional terminals of the first terminal group; the second terminal group includes a second dummy terminal in at least one space between the functional terminals of the second terminal group; and the first and second dummy terminals are not connected to any element inside the electronic component.

The electronic component includes dummy terminals, and it is possible to reserve some space for wiring around each dummy terminal. Therefore, a ground wire, or the like, can be extended to reach the electronic component, and it is possible to improve the impedance matching between a wire connected to a functional terminal and the electronic component.

An electronic component to be mounted on a circuit board in one illustrative embodiment of the present invention includes: a first terminal group including a plurality of functional terminals provided along a first side of the electronic component; a second terminal group including a plurality of functional terminals provided along a second side of the electronic component opposing the first side; and an element that is connected to at least one of the functional terminals of the first terminal group and to at least one of the functional terminals of the second terminal group. A size of at least one space between the functional terminals of the first terminal group is such that a wire of the circuit board can pass therethrough; and; and a size of at least one space between the functional terminals of the second terminal group is such that a wire of the circuit board can pass therethrough.

A circuit board in one illustrative embodiment of the present invention is a circuit board carrying an electronic component thereon, the electronic component including: a first terminal group including a plurality of functional terminals provided along a first side of the electronic component; a second terminal group including a plurality of functional terminals provided along a second side of the electronic component opposing the first side; and an element that is connected to at least one of the functional terminals of the first terminal group and to at least one of the functional terminals of the second terminal group. The first terminal group includes a first dummy terminal in at least one space between the functional terminals of the first terminal group; the second terminal group includes a second dummy terminal in at least one space between the functional terminals of the second terminal group; the first and second dummy terminals are not connected to any element inside the electronic component; and the first or second dummy terminal is connected to a ground wire of the circuit board.

A circuit board in one illustrative embodiment of the present invention is a circuit board carrying an electronic component thereon, the electronic component including: a first terminal group including a plurality of functional terminals provided along a first side of the electronic component; a second terminal group including a plurality of functional terminals provided along a second side of the electronic component opposing the first side; and an element that is connected to at least one of the functional terminals of the first terminal group and to at least one of the functional terminals of the second terminal group. A size of at least one space between the functional terminals of the first terminal group is such that a wire of the circuit board can pass therethrough; a size of at least one space between the functional terminals of the second terminal group is such that a wire of the circuit board can pass therethrough; and the circuit board includes a ground wire that passes through the space of the first terminal group and the space of the second terminal group.

DETAILED DESCRIPTION OF THE INVENTION

Embodiments of the present invention will now be described with reference to the drawings. In the various figures, elements indicated by reference numbers sharing the same last two digits correspond to each other, and are identical or similar elements to each other.

Figure 1:
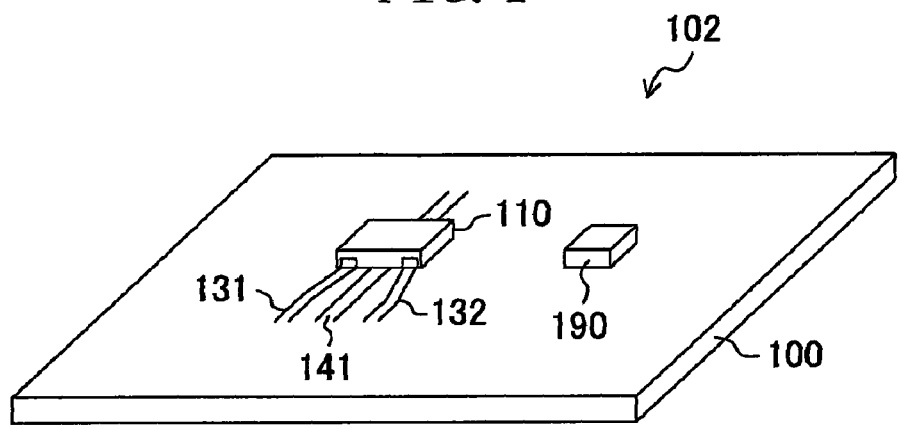
FIG. 1 is a perspective view showing a configuration of a circuit board carrying an electronic component according to an embodiment of the present invention.

FIG. 1 is a perspective view showing a configuration of a circuit board including an electronic component according to an embodiment of the present invention. A circuit board 102 of FIG. 1 includes a bare board 100, and electronic components 110 and 190. The bare board 100 includes thereon wires such as wires 131 and 132 and a ground wire 141. The bare board 100 is, for example, a multilayer printed wiring board.

Figure 2:
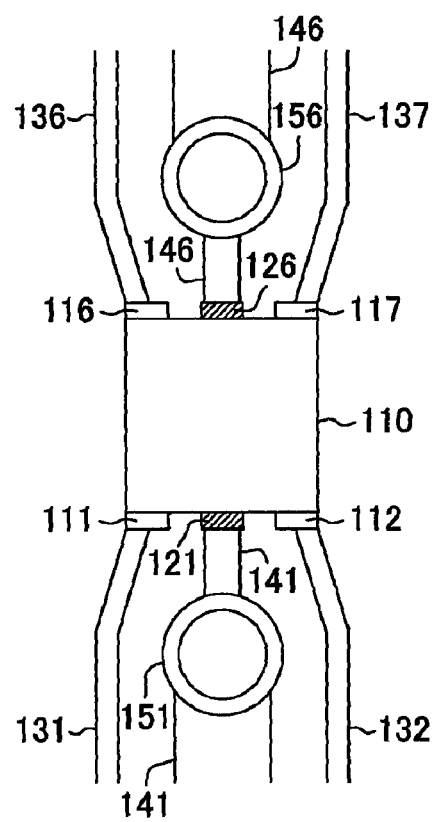
FIG. 2 is a plan view showing the electronic component of FIG. 1 and a wiring pattern therearound on the circuit board.

FIG. 2 is a plan view showing the electronic component 110 of FIG. 1 and a wiring pattern therearound on the circuit board 102. The circuit board 102 includes wires 131, 132, 136 and 137, ground wires 141 and 146, and vias 151 and 156. The electronic component 110 includes functional terminals 111, 112, 116 and 117 and dummy terminals 121 and 126. The functional terminals 111, 112, 116 and 117 are terminals that are connected to internal elements of the electronic component 110, and the dummy terminals 121 and 126 are terminals that are not connected to the internal elements of the electronic component 110. The functional terminals 111 and 112 and the dummy terminal 121 together form a first terminal group, and the functional terminals 116 and 117 and the dummy terminal 126 together form a second terminal group.

The electronic component 110 is accommodated in a package such as a ceramic package or a plastic package. While the functional terminals 111, 112, 116 and 117 and the dummy terminals 121 and 126 are protruding out of the package in the illustrated example, these terminals may be in the form of electrodes or pieces of foil on the surface of the package. This similarly applies to other electronic components to be described below.

The wires 131, 132, 136 and 137 are connected to the functional terminals 111, 112, 116 and 117, respectively. The ground wires 141 and 146 are connected to the dummy terminals 121 and 126, respectively. Terminals of the electronic component 110 are connected to wires of the circuit board 102 by soldering, for example. This similarly applies to other electronic components to be described below. The vias 151 and 156 connect the ground wires or the ground layer in a layer below the surface of the circuit board 102, to which the ground potential should be applied, with the ground wires 141 and 146.

Figure 3:
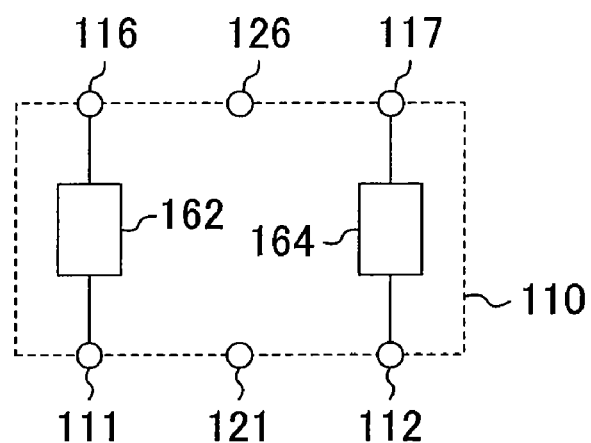
FIG. 3 is a block diagram showing an internal configuration of the electronic component of FIG. 2.

FIG. 3 is a block diagram showing an internal configuration of the electronic component 110 of FIG. 2. The electronic component 110 includes elements 162 and 164. The elements 162 and 164 are resistors, inductors, ferrite beads, etc., but may be any other 2-terminal elements. The elements 162 and 164 may each be a passive element, or an active element such as a diode, or a transistor, an FET, or the like, one terminal of which is connected to another terminal thereof. The elements 162 and 164 may each be a 2-terminal element obtained by combining a plurality of elements together.

The element 162 is connected to the functional terminals 111 and 116, and the element 164 is connected to the functional terminals 112 and 117. The dummy terminals 121 and 126 are connected to none of the elements 162 and 164.

Figure 4:
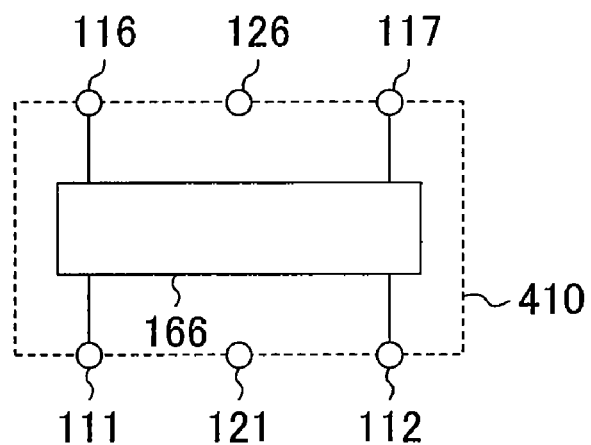
FIG. 4 is a block diagram showing another internal configuration of the electronic component of FIG. 2.

FIG. 4 is a block diagram showing another internal configuration of the electronic component 110 of FIG. 2. An electronic component 410 of FIG. 4 includes an element 166. The element 166 is a filter obtained by combining together a resistor, a capacitor, an inductor, etc., but may be any other 4-terminal element. The element 166 may include a passive element, or may include an active element such as a diode, a transistor, an FET, or the like. The element 166 is connected to the functional terminals 111, 112, 116 and 117, but the dummy terminals 121 and 126 are not connected to the element 166.

The electronic component 110 of FIG. 2 receives a differential signal from the wires 131 and 132 via the functional terminals 111 and 112. The differential signal is, for example, a differential signal carrying data of one TMDS (Transition Minimized Differential Signaling) data channel defined in the HDMI standard. The electronic component 110 outputs a differential signal obtained based on the differential signal received from the wires 131 and 132 to the wires 136 and 137 via the functional terminals 116 and 117. A ground signal corresponding to the differential signal of the wires 131 and 132 may be given to the ground wire 141.

The wires 131 and 132 run along the ground wire 141. The characteristic impedance of the wire 131 or 132 as a transmission line varies depending on the distance between the wire 131 or 132 and the ground wire 141, and on the presence/absence of the ground wire 141. Since the electronic component 110 includes the dummy terminal 121, there is a space between the functional terminals 111 and 112 where the ground wire 141 can be provided, and the ground wire 141 can be extended to reach the electronic component 110. Since the ground wire 141 is not interrupted near the electronic component 110, the characteristic impedance of the wire 131 or 132 as a transmission line can be kept substantially constant up to the electronic component 110. Therefore, it is possible to improve the impedance matching between the transmission line (the wires 131 and 132 connected to the functional terminals 111 and 112) and the electronic component 110.

If the electronic component 110 does not include the dummy terminal 121, the electronic component 110 will be designed and produced as a component with a small space between the functional terminals 111 and 112 because a component preferably has a smaller size. In such a case, the ground wire 141 cannot be extended to reach the electronic component 110 because there is no sufficient space between the functional terminals 111 and 112, whereby the characteristic impedance of the wires 131 and 132 cannot be kept constant up to the electronic component 110.

Since the electronic component 110 includes the dummy terminal 126, ground wire 146 can be extended to reach the electronic component 110, the above discussion similarly applies to the impedance matching between the wires 136 and 137 and the electronic component 110.

Figure 5:
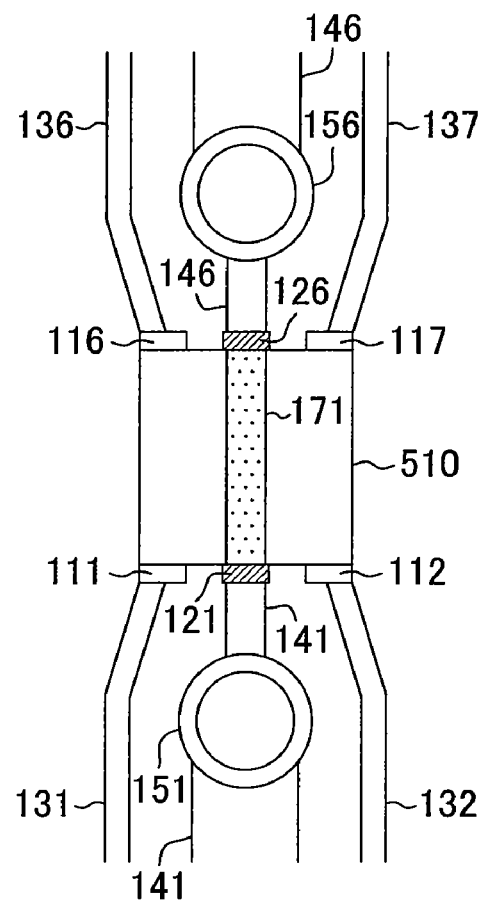
FIG. 5 is a plan view showing a first variation of the electronic component of FIG. 2 and a wiring pattern therearound on the circuit board.

FIG. 5 is a plan view showing a first variation of the electronic component 110 of FIG. 2 and a wiring pattern therearound on the circuit board 102. It is assumed herein that any of the following electronic components, including the electronic component of FIG. 5, is mounted on the circuit board 102 as is the electronic component 110. An electronic component 510 of FIG. 5 is different from the electronic component 110 of FIG. 2 in that the dummy terminals 121 and 126 are electrically connected to each other by a conductor.

Figure 6:
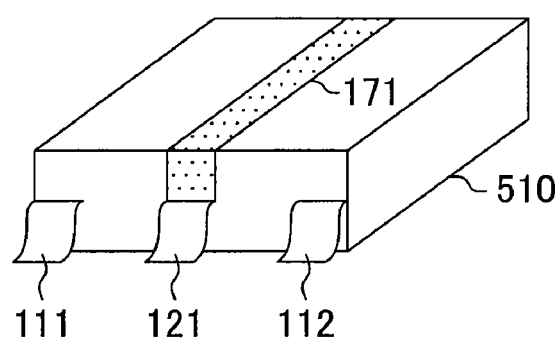
FIG. 6 is a perspective view showing the electronic component of FIG. 5.

FIG. 6 is a perspective view showing the electronic component 510 of FIG. 5. As shown in FIG. 6, the dummy terminals 121 and 126 of the electronic component 510 are connected to each other by a conductor 171 on the surface of the electronic component 510. Although not shown in FIG. 6, the electronic component 510 includes the functional terminals 116 and 117 and the dummy terminal 126 along a side opposite to the side along which the functional terminals 111 and 112 and the dummy terminal 121 are provided. This similarly applies to other perspective views.

Figure 7:
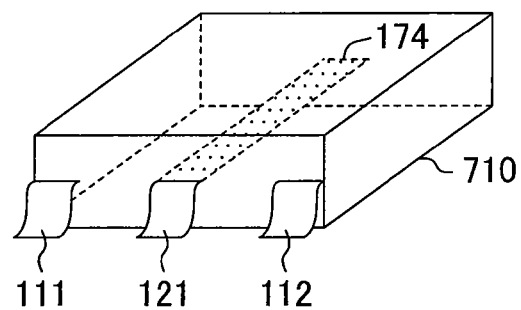
FIG. 7 is a perspective view showing a variation of the electronic component of FIG. 5.

FIG. 7 is a perspective view showing a variation of the electronic component 510 of FIG. 5. The dummy terminals 121 and 126 of an electronic component 710 of FIG. 7 are connected to each other by a conductor 174 inside the electronic component 710. The conductors 171 and 174 are each an aluminum thin plate or film, for example, they may be any type of members as long as they are formed from conductive material. For example, such conductive material may be silicon, copper, iron, or any suitable material which allows electrical connection. This similarly applies to other electronic components in the present description.

With the electronic components 510 and 710 of FIGS. 5 to 7, the ground wires 141 and 146 can be connected to each other, whereby it is possible to improve the impedance matching between the electronic components 510 and 710 and the wires 131, 132, 136 and 137. Particularly, if the conductor 171 is provided on the surface of the electronic component 510 as shown in FIG. 6, the internal elements and the internal circuit of the electronic component 510 are unlikely to be influenced. Therefore, when adding the conductor 171 to the electronic component 110, it is not necessary to re-design the inside of the electronic component 110, thus saving the design cost.

Figure 8:
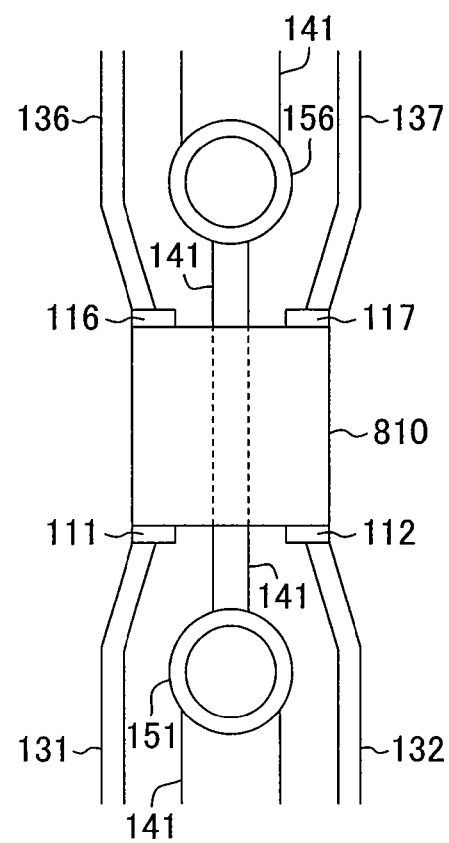
FIG. 8 is a plan view showing a second variation of the electronic component of FIG. 2 and a wiring pattern therearound on the circuit board.

FIG. 8 is a plan view showing a second variation of the electronic component 110 of FIG. 2 and a wiring pattern therearound on the circuit board 102. An electronic component 810 of FIG. 8 is different from the electronic component 110 in that the dummy terminals 121 and 126 are not provided. The space between the functional terminals 111 and 112 and that between the functional terminals 116 and 117 are as large as those in the electronic component 110, such that a wire of the circuit board 102 can pass therethrough. The ground wire 141 passes through these spaces.

With the electronic component 810 of FIG. 8, since there is a space between the functional terminals 111 and 112 and between the functional terminals 116 and 117, with the size of the space being such that a wire of the circuit board 102 can pass therethrough, the ground wire 141 can pass through these spaces. Therefore, even if the dummy terminals 121 and 126 are not provided, it is possible to improve the impedance matching between the electronic component 810 and the wires 131, 132, 136 and 137, as with the electronic component 110 or 510 of FIG. 2 or 5.

Figure 9:
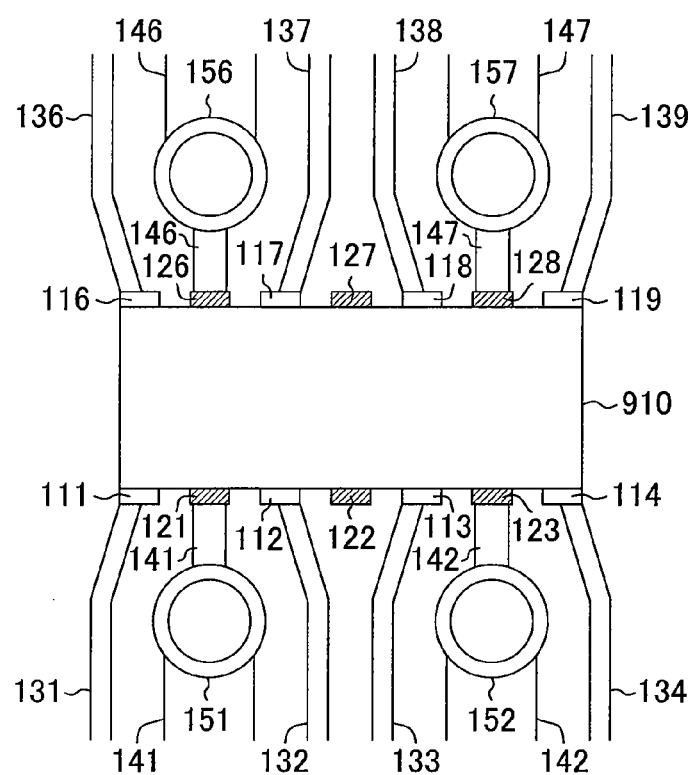
FIG. 9 is a plan view showing a third variation of the electronic component of FIG. 2 and a wiring pattern therearound on the circuit board.

FIG. 9 is a plan view showing a third variation of the electronic component 110 of FIG. 2 and a wiring pattern therearound on the circuit board 102. The circuit board 102 further includes wires 133, 134, 138 and 139, ground wires 142 and 147, and vias 152 and 157. An electronic component 910 of FIG. 9 is different from the electronic component 110 of FIG. 2 in that the electronic component 910 further includes functional terminals 113, 114, 118 and 119 and dummy terminals 122, 123, 127 and 128.

As with the electronic component 110, the functional terminals 111 to 114 and 116 to 119 are terminals that are connected to the internal elements of the electronic component 910, and the dummy terminals 121 to 123 and 126 to 128 are terminals that are not connected to the internal elements of the electronic component 910. The functional terminals 111 to 114 and the dummy terminals 121 to 123 together form a first terminal group, and the functional terminals 116 to 119 and the dummy terminals 126 to 128 together form a second terminal group.

The wires 131 to 134 and 136 to 139 are connected to the functional terminals 111 to 114 and 116 to 119, respectively. The ground wires 141, 142, 146 and 147 are connected to the dummy terminals 121, 123, 126 and 128, respectively. The vias 151, 152, 156 and 157 connect the ground wires or the ground layer in a layer below the surface of the circuit board 102, to which the ground potential should be applied, with the ground wires 141, 142, 146 and 147.

The electronic component 910 of FIG. 9 receives a differential signal from the wires 131 and 132 via the functional terminals 111 and 112, and receives a differential signal from the wires 133 and 134 via the functional terminals 113 and 114. The differential signal is, for example, a differential signal carrying data of one TMDS data channel defined in the HDMI standard. The electronic component 910 outputs a differential signal obtained based on the differential signal received from the wires 131 and 132 to the wires 136 and 137 via the functional terminals 116 and 117, and outputs a differential signal obtained based on the differential signal received from the wires 133 and 134 to the wires 138 and 139 via the functional terminals 118 and 119. A ground signal corresponding to the differential signal of the wires 131 and 132 may be given to the ground wire 141, and a ground signal corresponding to the differential signal of the wires 133 and 134 may be given to ground wire 142.

The wires 131 and 132 run along the ground wire 141, the wires 133 and 134 run along the ground wire 142, and the wires 136 and 137 run along the ground wire 146, and the wires 138 and 139 run along the ground wire 147. Since the electronic component 910 includes the dummy terminals 121, 123, 126 and 128, the ground wires 141, 142, 146 and 147 can be extended to reach the electronic component 910. Since the ground wires 141, 142, 146 and 147 are not interrupted near the electronic component 910, the characteristic impedance of the wires 131 to 134 and 136 to 139 as transmission lines can be kept substantially constant up to the electronic component 910, and it is possible to improve the impedance matching between the wires 131 to 134 and 136 to 139 and the electronic component 910.

Figure 10:
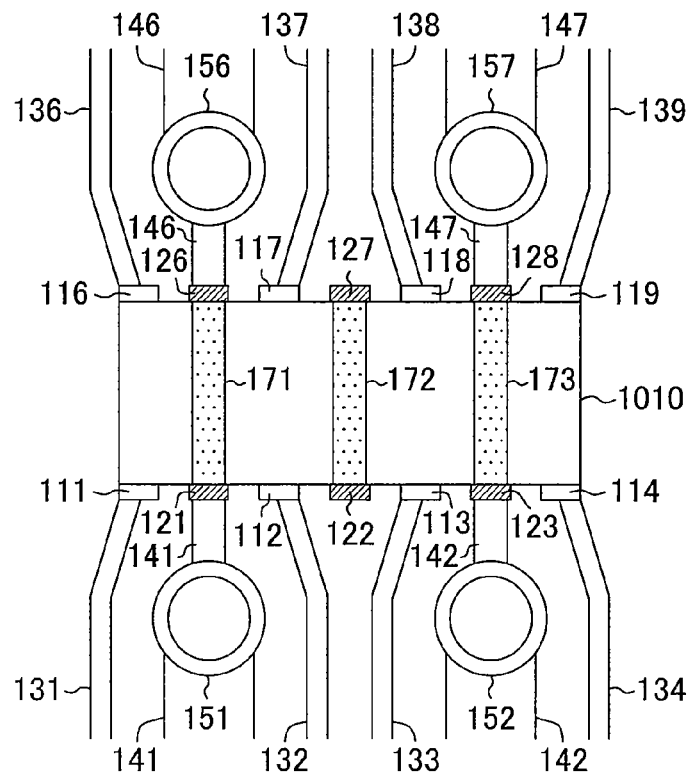
FIG. 10 is a plan view showing a variation of the electronic component of FIG. 9 and a wiring pattern therearound on the circuit board.
Figure 11:
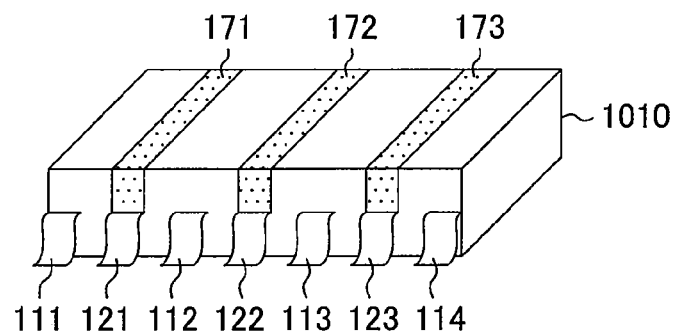
FIG. 11 is a perspective view showing the electronic component of FIG. 10.

FIG. 10 is a plan view showing a variation of the electronic component 910 of FIG. 9 and a wiring pattern therearound on the circuit board 102. An electronic component 1010 of FIG. 10 is different from the electronic component 910 of FIG. 9 in that the dummy terminals 121 and 126 are connected to each other by a conductor 171, the dummy terminals 122 and 127 by a conductor 172, and the dummy terminals 123 and 128 by a conductor 173. FIG. 11 is a perspective view showing the electronic component 1010 of FIG. 10. As shown in FIG. 11, the conductors 171 to 173 are provided on the surface of the electronic component 1010, each connecting dummy terminals to each other.

Figure 12:
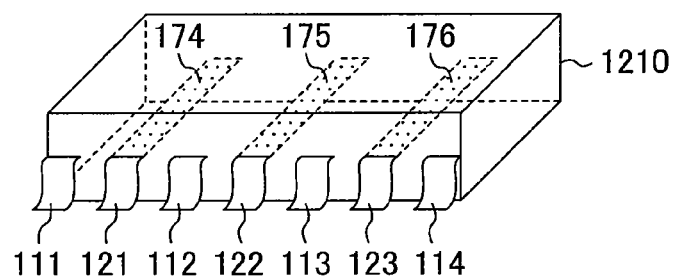
FIG. 12 is a perspective view showing a variation of the electronic component of FIG. 10.

FIG. 12 is a perspective view showing a variation of the electronic component 1010 of FIG. 10. As shown in FIG. 12, conductors 174, 175 and 176 are provided inside an electronic component 1210, each connecting dummy terminals to each other. As with the electronic components 510 and 710 of FIGS. 5 and 7, the conductors 171 to 176 may be any type of members as long as they are conductive.

With the electronic components 1010 and 1210 of FIGS. 10 to 12, the ground wires 141 and 146 can be connected to each other and the ground wires 142 and 147 can be connected to each other, whereby it is possible to improve the impedance matching between the electronic components 1010 and 1210 and the wires 131 to 134 and 136 to 139.

Figure 13:
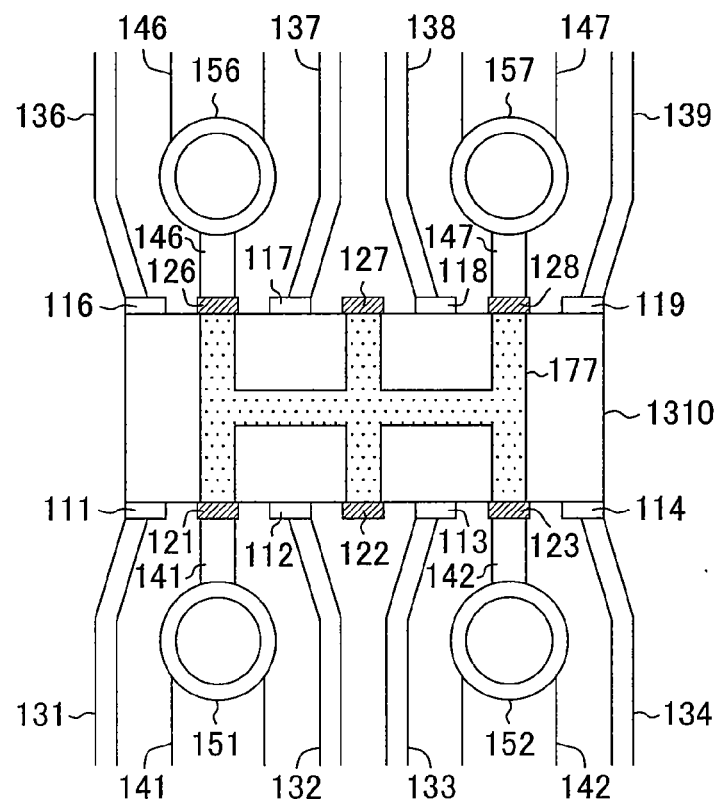
FIG. 13 is a plan view showing another variation of the electronic component of FIG. 9 and a wiring pattern therearound on the circuit board.
Figure 14:
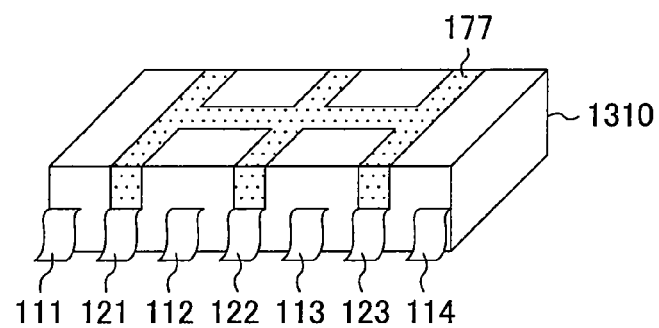
FIG. 14 is a perspective view showing the electronic component of FIG. 13.

FIG. 13 is a plan view showing another variation of the electronic component 910 of FIG. 9 and a wiring pattern therearound on the circuit board 102. An electronic component 1310 of FIG. 13 is different from the electronic component 1010 of FIG. 10 in that the dummy terminals 121 to 123 and 126 to 128 are electrically connected to each other by a conductor 177. FIG. 14 is a perspective view showing the electronic component 1310 of FIG. 13. As shown in FIG. 14, the conductor 177 is provided on the surface of the electronic component 1310, connecting dummy terminals together.

Figure 15:
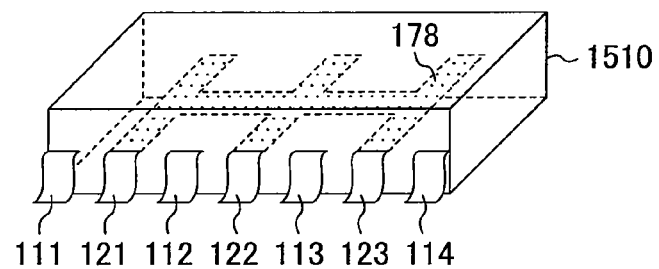
FIG. 15 is a perspective view showing a variation of the electronic component of FIG. 13.

FIG. 15 is a perspective view showing a variation of the electronic component 1310 of FIG. 13. As shown in FIG. 15, a conductor 178 is provided inside an electronic component 1510, connecting dummy terminals together. As with the electronic components 510 and 710 of FIGS. 5 and 7, the conductors 177 and 178 may be any type of members as long as they are conductive.

With the electronic components 1310 and 1510 of FIGS. 13 to 15, the ground wires 141, 142, 146 and 147 can be connected to each other, whereby it is possible to reduce the potential difference between the ground wires.

Figure 16:
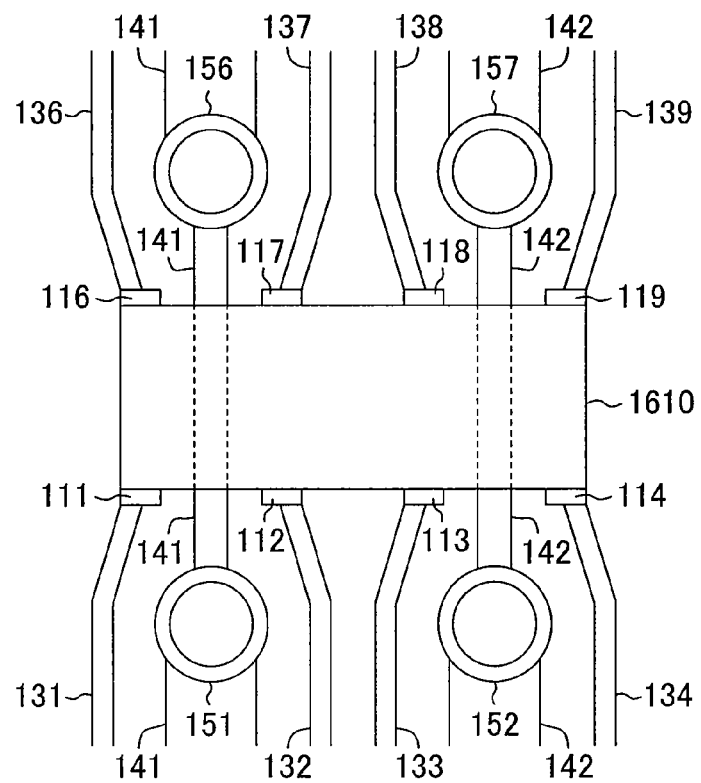
FIG. 16 is a plan view showing still another variation of the electronic component of FIG. 9 and a wiring pattern therearound on the circuit board.

FIG. 16 is a plan view showing still another variation of the electronic component 910 of FIG. 9 and a wiring pattern therearound on the circuit board 102. An electronic component 1610 of FIG. 16 is different from the electronic component 910 in that the dummy terminals 121 to 123 and 126 to 128 are not provided. The space between the functional terminals 111 and 112, that between the functional terminals 112 and 113, that between the functional terminals 113 and 114, that between the functional terminals 116 and 117, that between the functional terminals 117 and 118 and that between the functional terminals 118 and 119 are as large as those in the electronic component 910, such that a wire of the circuit board 102 can pass therethrough.

The ground wire 141 passes through the space between the functional terminals 111 and 112 and that between the functional terminals 116 and 117. The ground wire 142 passes through the space between the functional terminals 113 and 114 and that between the functional terminals 118 and 119.

With the electronic component 1610 of FIG. 16, the ground wires 141 and 142 pass through spaces between functional terminals, whereby it is possible to improve the impedance matching between the electronic component 1610 and the wires 131 to 134 and 136 to 139, as with the electronic components 910 and 1010 of FIGS. 9 and 10, even though the dummy terminals 121 to 123 and 126 to 128 are not provided.

Figure 17:
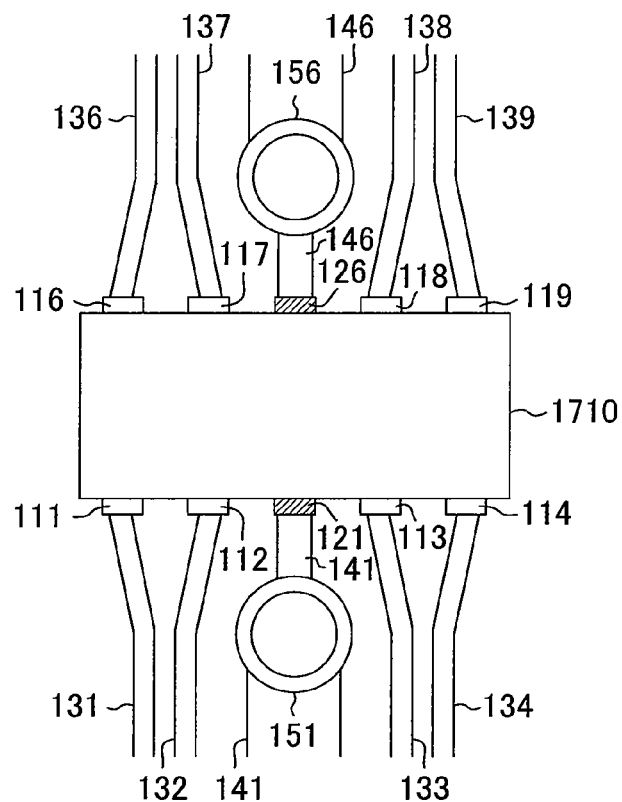
FIG. 17 is a plan view showing a fourth variation of the electronic component of FIG. 2 and a wiring pattern therearound on the circuit board.

FIG. 17 is a plan view showing a fourth variation of the electronic component 110 of FIG. 2 and a wiring pattern therearound on the circuit board 102. The circuit board 102 further includes the wires 133, 134, 138 and 139. An electronic component 1710 of FIG. 17 is different from the electronic component 110 of FIG. 2 in that the electronic component 1710 further includes the functional terminals 113, 114, 118 and 119.

As with the electronic component 110, the functional terminals 111 to 114 and 116 to 119 are terminals that are connected to the internal elements of the electronic component 1710, and the dummy terminals 121 and 126 are terminals that are not connected to the internal elements of the electronic component 1710. The functional terminals 111 to 114 and the dummy terminal 121 together form a first terminal group, and the functional terminals 116 to 119 and the dummy terminal 126 together form a second terminal group.

The wires 131 to 134 and 136 to 139 are connected to the functional terminals 111 to 114 and 116 to 119, respectively. The ground wires 141 and 146 are connected to the dummy terminals 121 and 126, respectively. The vias 151 and 156 connect the ground wires or the ground layer in a layer below the surface of the circuit board 102, to which the ground potential should be applied, with the ground wires 141 and 146.

The electronic component 1710 of FIG. 17 receives a differential signal from the wires 131 and 132 via the functional terminals 111 and 112, and receives a differential signal from the wires 133 and 134 via the functional terminals 113 and 114. The differential signal is, for example, a differential signal carrying data of one TMDS data channel defined in the HDMI standard. The electronic component 1710 outputs a differential signal obtained based on the differential signal received from the wires 131 and 132 to the wires 136 and 137 via the functional terminals 116 and 117, and outputs a differential signal obtained based on the differential signal received from the wires 133 and 134 to the wires 138 and 139 via the functional terminals 118 and 119.

The wires 131 to 134 run along the ground wire 141, and the wires 136 to 139 run along the ground wire 146. Since the electronic component 1710 includes the dummy terminals 121 and 126, the ground wires 141 and 146 can be extended to reach the electronic component 1710. Since the ground wires 141 and 146 are not interrupted near the electronic component 1710, the characteristic impedance of the wires 131 to 134 and 136 to 139 as transmission lines can be kept substantially constant up to the electronic component 1710, and it is possible to improve the impedance matching between the wires 131 to 134 and 136 to 139 and the electronic component 1710.

Figure 18:
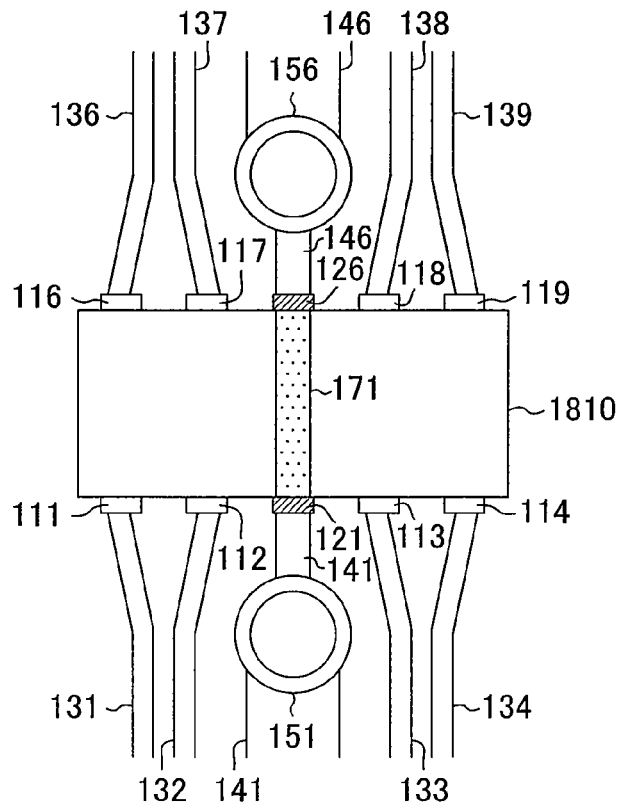
FIG. 18 is a plan view showing a variation of the electronic component of FIG. 17 and a wiring pattern therearound on the circuit board.
Figure 19:
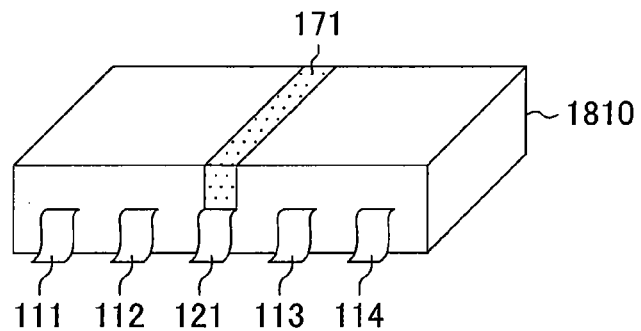
FIG. 19 is a perspective view showing the electronic component of FIG. 18.

FIG. 18 is a plan view showing a variation of the electronic component 1710 of FIG. 17 and a wiring pattern therearound on the circuit board 102. An electronic component 1810 of FIG. 18 is different from the electronic component 1710 of FIG. 17 in that the dummy terminals 121 and 126 are electrically connected to each other by the conductor 171. FIG. 19 is a perspective view showing the electronic component 1810 of FIG. 18. As shown in FIG. 19, the conductor 171 is provided on the surface of the electronic component 1810, connecting dummy terminals together.

Figure 20:
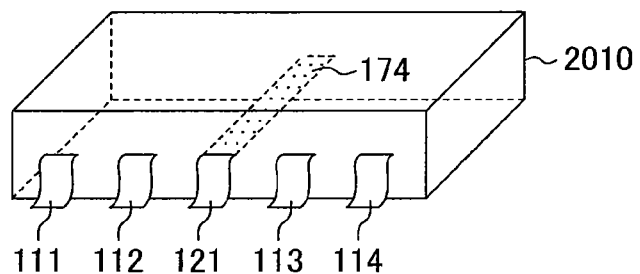
FIG. 20 is a perspective view showing a variation of the electronic component of FIG. 18.

FIG. 20 is a perspective view showing a variation of the electronic component 1810 of FIG. 18. As shown in FIG. 20, the conductor 174 is provided inside an electronic component 2010, connecting dummy terminals together. As with the electronic components 510 and 710 of FIGS. 5 and 7, the conductors 171 and 174 may be any type of members as long as they are conductive.

With the electronic components 1810 and 2010 of FIGS. 18 to 20, the ground wires 141 and 146 can be connected to each other, whereby it is possible to further improve the impedance matching between the electronic components 1810 and 2010 and the wires 131 to 134 and 136 to 139.

Figure 21:
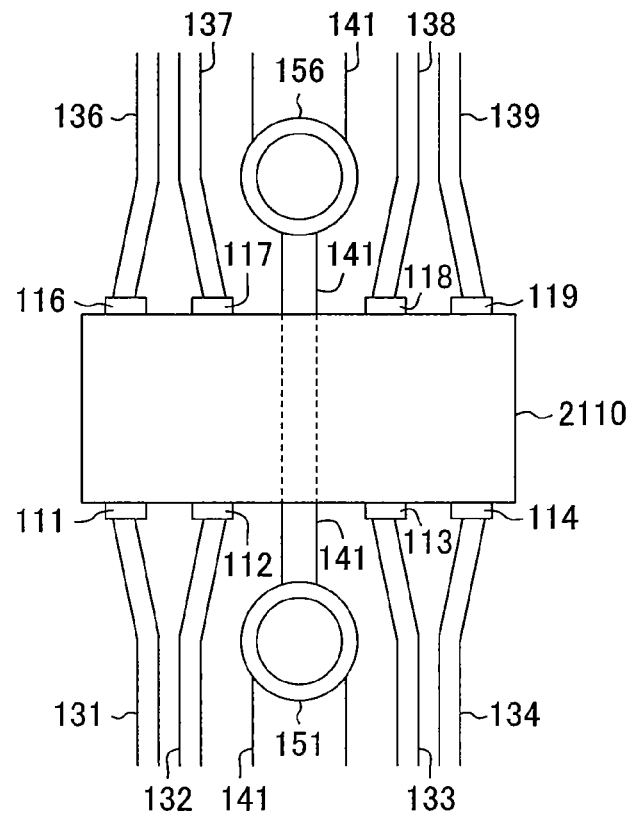
FIG. 21 is a plan view showing another variation of the electronic component of FIG. 17 and a wiring pattern therearound on the circuit board.

FIG. 21 is a plan view showing another variation of the electronic component 1710 of FIG. 17 and a wiring pattern therearound on the circuit board 102. An electronic component 2110 of FIG. 21 is different from the electronic component 1710 in that the dummy terminals 121 and 126 are not provided. The space between the functional terminals 112 and 113 and that between the functional terminals 117 and 118 are as large as those in the electronic component 1710, such that a wire of the circuit board 102 can pass therethrough. The ground wire 141 passes through the space between the functional terminals 112 and 113 and that between the functional terminals 117 and 118.

With the electronic component 2110 of FIG. 21, the ground wire 141 passes through the space between functional terminals, whereby it is possible to improve the impedance matching between the electronic component 2110 and the wires 131 to 134 and 136 to 139, as with the electronic components 1710 and 1810 of FIGS. 17 and 18, even though the dummy terminals 121 and 126 are not provided.

Figure 22:
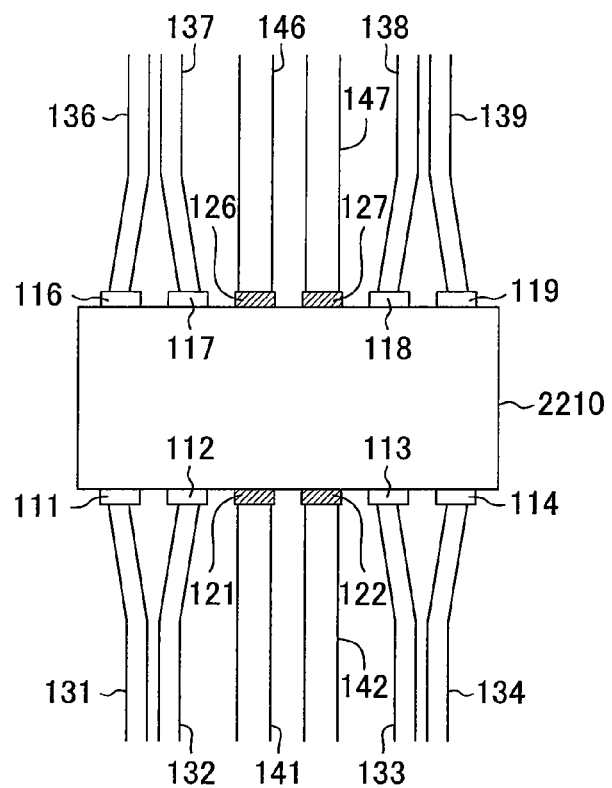
FIG. 22 is a plan view showing still another variation of the electronic component of FIG. 17 and a wiring pattern therearound on the circuit board.

FIG. 22 is a plan view showing still another variation of the electronic component 1710 of FIG. 17 and a wiring pattern therearound on the circuit board 102. The circuit board 102 further includes the ground wires 142 and 147. An electronic component 2210 of FIG. 22 is different from the electronic component 1710 of FIG. 17 in that the electronic component 2210 further includes the dummy terminals 122 and 127 in addition to the dummy terminals 121 and 126.

As with the electronic component 110, the functional terminals 111 to 114 and 116 to 119 are terminals that are connected to the internal elements of the electronic component 2210, and the dummy terminals 121, 122, 126 and 127 are terminals that are not connected to the internal elements of the electronic component 2210. The functional terminals 111 to 114 and the dummy terminals 121 and 122 together form a first terminal group, and the functional terminals 116 to 119 and the dummy terminals 126 and 127 together form a second terminal group. The ground wires 141, 142, 146 and 147 are connected to the dummy terminals 121, 122, 126 and 127, respectively.

Since the electronic component 2210 includes two dummy terminals between the functional terminals 112 and 113 and two others between the functional terminals 117 and 118, it is possible to give a ground signal corresponding to the differential signal of the wires 131 and 132 to the ground wire 141 and to give a ground signal corresponding to the differential signal of the wires 133 and 134 to the ground wire 142. Therefore, it is possible to more accurately transmit differential signals. Otherwise, the electronic component is similar to the electronic component 1710 of FIG. 17.

Figure 23:
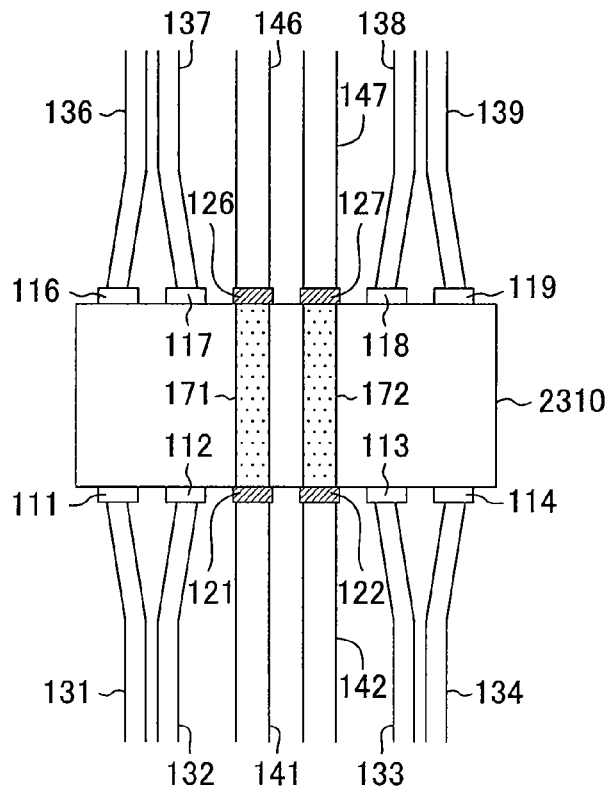
FIG. 23 is a plan view showing a variation of the electronic component of FIG. 22 and a wiring pattern therearound on the circuit board.
Figure 24:
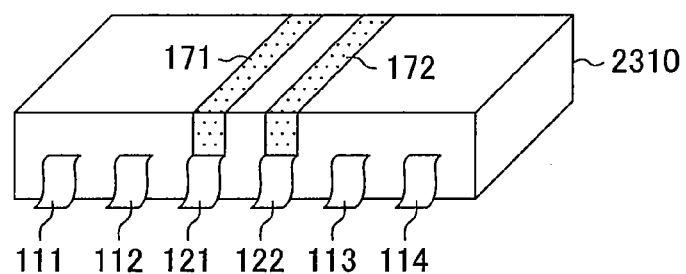
FIG. 24 is a perspective view showing the electronic component of FIG. 23.

FIG. 23 is a plan view showing a variation of the electronic component 2210 of FIG. 22 and a wiring pattern therearound on the circuit board 102. An electronic component 2310 of FIG. 23 is different from the electronic component 2210 of FIG. 22 in that the dummy terminals 121 and 126 are electrically connected to each other by the conductor 171, and the dummy terminals 122 and 127 are electrically connected to each other by the conductor 172. FIG. 24 is a perspective view showing the electronic component 2310 of FIG. 23. As shown in FIG. 24, the conductors 171 and 172 are provided on the surface of the electronic component 2310, connecting dummy terminals together.

Figure 25:
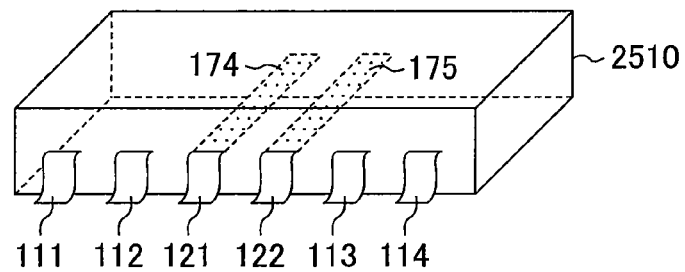
FIG. 25 is a perspective view showing a variation of the electronic component of FIG. 23.

FIG. 25 is a perspective view showing a variation of the electronic component 2310 of FIG. 23. As shown in FIG. 25, the conductors 174 and 175 are provided inside an electronic component 2510, connecting dummy terminals together. As with the electronic components 510 and 710 of FIGS. 5 and 7, the conductors 171, 172, 174 and 175 may be any type of members as long as they are conductive.

With the electronic components 2310 and 2510 of FIGS. 23 to 25, the ground wires 141 and 146 can be connected to each other and the ground wires 142 and 147 can be connected to each other, whereby it is possible to improve the impedance matching between the electronic components 2310 and 2510 and the wires 131 to 134 and 136 to 139.

Figure 26:
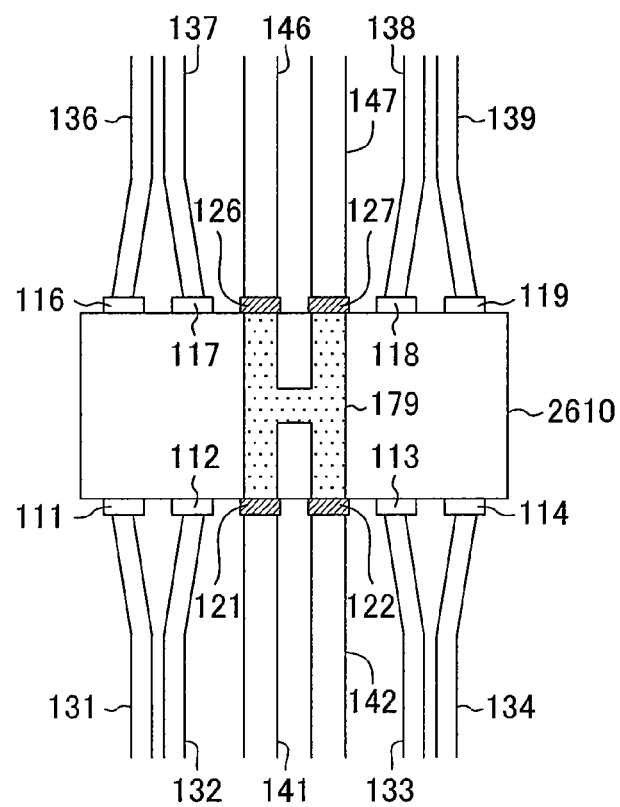
FIG. 26 is a plan view showing another variation of the electronic component of FIG. 22 and a wiring pattern therearound on the circuit board.
Figure 27:
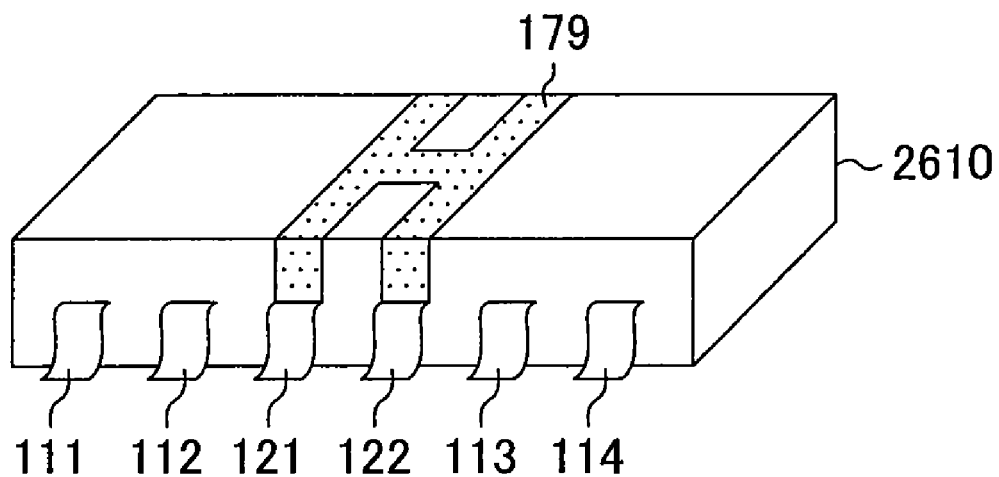
FIG. 27 is a perspective view showing the electronic component of FIG. 26.

FIG. 26 is a plan view showing another variation of the electronic component 2210 of FIG. 22 and a wiring pattern therearound on the circuit board 102. An electronic component 2610 of FIG. 26 is different from the electronic component 2310 of FIG. 23 in that the dummy terminals 121, 122, 126 and 127 are electrically connected to each other by a conductor 179. FIG. 27 is a perspective view showing the electronic component 2610 of FIG. 26. As shown in FIG. 27, the conductor 179 is provided on the surface of the electronic component 2610, connecting dummy terminals together.

Figure 28:
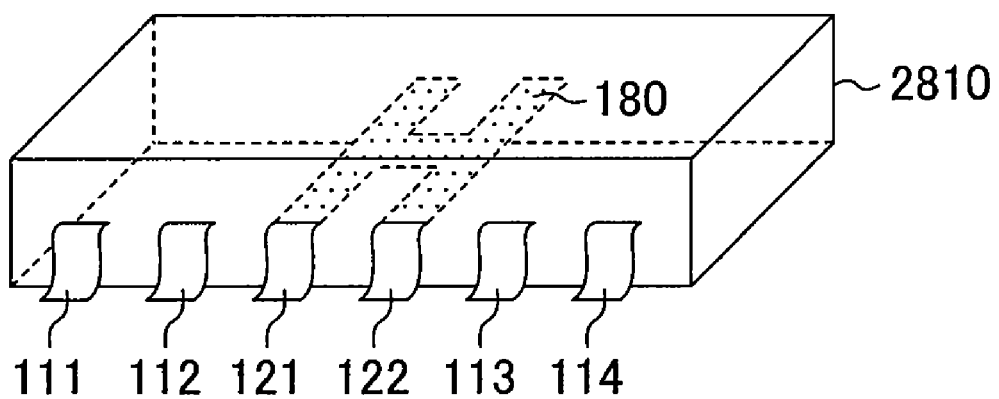
FIG. 28 is a perspective view showing a variation of the electronic component of FIG. 26.

FIG. 28 is a perspective view showing a variation of the electronic component 2610 of FIG. 26. As shown in FIG. 28, a conductor 180 is provided inside an electronic component 2810, connecting dummy terminals together. As with the electronic components 510 and 710 of FIGS. 5 and 7, the conductors 179 and 180 may be any type of members as long as they are conductive.

With the electronic components 2610 and 2810 of FIGS. 26 to 28, the ground wires 141, 142, 146 and 147 can be connected to each other, whereby it is possible to reduce the potential difference between the ground wires.

Many features and advantages of the present invention are apparent from the description herein, and it is therefore intended that such features and advantages of the present invention be all covered by the appended claims. Moreover, many changes and modifications will readily occur to those skilled in the art, and the present invention should therefore not be limited to those configurations and operations illustrated and described herein. All such modifications and equivalents shall fall within the scope of the present invention.

What is claimed is:

1. An electronic component, comprising:
   a first terminal group including a plurality of functional terminals provided along a first side of the electronic component;
   a second terminal group including a plurality of functional terminals provided along a second side of the electronic component opposing the first side; and
   an element that is connected to at least one of the functional terminals of the first terminal group and to at least one of the functional terminals of the second terminal group, wherein
   the first terminal group includes a first dummy terminal in at least one space between the functional terminals of the first terminal group;
   the second terminal group includes a second dummy terminal in at least one space between the functional terminals of the second terminal group; and
   the first and second dummy terminals are not connected to any element inside the electronic component,
   wherein two functional terminals adjacent to the first dummy terminal of the first terminal group receive a differential signal; and
   two functional terminals adjacent to the second dummy terminal of the second terminal group output a differential signal based on the received differential signal.

2. The electronic component of claim 1, wherein the first dummy terminal and the second dummy terminal are electrically connected to each other.

3. The electronic component of claim 2, wherein the first dummy terminal and the second dummy terminal are connected to each other by a conductive material provided on a surface of the electronic component.

4. The electronic component of claim 2, wherein the first dummy terminal and the second dummy terminal are connected to each other by a conductive material provided inside the electronic component.

5. The electronic component of claim 1, wherein
   the first terminal group includes a plurality of the first dummy terminals in a plurality of spaces between the functional terminals of the first terminal group; and
   the second terminal group includes a plurality of the second dummy terminals in a plurality of spaces between the functional terminals of the second terminal group.

6. The electronic component of claim 5, wherein each of the first dummy terminals is electrically connected to a corresponding one of the second dummy terminals.

7. The electronic component of claim 6, wherein each of the first dummy terminals is connected to a corresponding one of the second dummy terminals by a conductive material provided on a surface of the electronic component.

8. The electronic component of claim 6, wherein each of the first dummy terminals is connected to a corresponding one of the second dummy terminals by a conductive material provided inside the electronic component.

9. The electronic component of claim 5, wherein the first dummy terminals and the second dummy terminals are electrically connected to each other.

10. The electronic component of claim 9, wherein the first dummy terminals and the second dummy terminals are connected to each other by a conductive material provided on a surface of the electronic component.

11. The electronic component of claim 9, wherein the first dummy terminals and the second dummy terminals are connected to each other by a conductive material provided inside the electronic component.

12. The electronic component of claim 1, wherein
    the first terminal group includes a plurality of the first dummy terminals in at least one space between the functional terminals of the first terminal group; and
    the second terminal group includes a plurality of the second dummy terminals in at least one space between the functional terminals of the second terminal group.

13. The electronic component of claim 12, wherein each of the first dummy terminals is electrically connected to a corresponding one of the second dummy terminals.

14. The electronic component of claim 13, wherein each of the first dummy terminals is connected to a corresponding one of the second dummy terminals by a conductive material provided on a surface of the electronic component.

15. The electronic component of claim 13, wherein each of the first dummy terminals is connected to a corresponding one of the second dummy terminals by a conductive material provided inside the electronic component.

16. An electronic component, comprising:
    a first terminal group including a plurality of functional terminals provided along a first side of the electronic component;
    a second terminal group including a plurality of functional terminals provided along a second side of the electronic component opposing the first side; and
    an element that is connected to at least one of the functional terminals of the first terminal group and to at least one of the functional terminals of the second terminal group, wherein
    the first terminal group includes a first dummy terminal in at least one space between the functional terminals of the first terminal group;
    the second terminal group includes a second dummy terminal in at least one space between the functional terminals of the second terminal group; and
    the first and second dummy terminals are not connected to any element inside the electronic component,
    wherein
    a first one of two functional terminals that are adjacent to the first dummy terminal and another functional terminal adjacent thereto receive a first differential signal;
    a second one of the two functional terminals that are adjacent to the first dummy terminal and another functional terminal adjacent thereto receive a second differential signal;
    a first one of two functional terminals that are adjacent to the second dummy terminal and another functional terminal adjacent thereto output a differential signal based on the first differential signal; and
    a second one of the two functional terminals that are adjacent to the second dummy terminal and another functional terminal adjacent thereto output a differential signal based on the second differential signal.

17. The electronic component of claim 16, wherein the first dummy terminal and the second dummy terminal are electrically connected to each other.

18. The electronic component of claim 17, wherein the first dummy terminal and the second dummy terminal are connected to each other by a conductive material provided on a surface of the electronic component.

19. The electronic component of claim 17, wherein the first dummy terminal and the second dummy terminal are connected to each other by a conductive material provided inside the electronic component.

20. An electronic component to be mounted on a circuit board, comprising:

a first terminal group including a plurality of functional terminals provided along a first side of the electronic component;
a second terminal group including a plurality of functional terminals provided along a second side of the electronic component opposing the first side; and
an element that is connected to at least one of the functional terminals of the first terminal group and to at least one of the functional terminals of the second terminal group, wherein
a size of at least one space between the functional terminals of the first terminal group is such that a wire of the circuit board can pass therethrough; and
a size of at least one space between the functional terminals of the second terminal group is such that a wire of the circuit board can pass therethrough,
wherein a first one of two functional terminals that are sandwiching therebetween at least one space between the functional terminals of the first terminal group and another functional terminal adjacent thereto receive a first differential signal;
a second one of two functional terminals that are sandwiching therebetween the at least one space between the functional terminals of the first terminal group and another functional terminal adjacent thereto receive a second differential signal;
a first one of two functional terminals that are sandwiching therebetween at least one space between the functional terminals of the second terminal group and another functional terminal adjacent thereto output a differential signal based on the first differential signal; and
a second one of two functional terminals that are sandwiching therebetween the at least one space between the functional terminals of the second terminal group and another functional terminal adjacent thereto output a differential signal based on the second differential signal.

21. The electronic component of claim 20, wherein
a size of a plurality of spaces between the plurality of functional terminals of the first terminal group is such that a wire of the circuit board can pass therethrough; and
a size of a plurality of spaces between the plurality of functional terminals of the second terminal group is such that a wire of the circuit board can pass therethrough.

22. A circuit board including an electronic component thereon, the electronic component comprising:
a first terminal group including a plurality of functional terminals provided along a first side of the electronic component;
a second terminal group including a plurality of functional terminals provided along a second side of the electronic component opposing the first side; and
an element that is connected to at least one of the functional terminals of the first terminal group and to at least one of the functional terminals of the second terminal group, wherein
the first terminal group includes a first dummy terminal in at least one space between the functional terminals of the first terminal group;
the second terminal group includes a second dummy terminal in at least one space between the functional terminals of the second terminal group;
the first and second dummy terminals are not connected to any element inside the electronic component; and
the first or second dummy terminal is connected to a ground wire of the circuit board,
wherein a first one of two functional terminals that are adjacent to the first dummy terminal and another functional terminal adjacent thereto receive a first differential signal;
a second one of the two functional terminals that are adjacent to the first dummy terminal and another functional terminal adjacent thereto receive a second differential signal;
a first one of two functional terminals that are adjacent to the second dummy terminal and another functional terminal adjacent thereto output a differential signal based on the first differential signal; and
a second one of the two functional terminals that are adjacent to the second dummy terminal and another functional terminal adjacent thereto output a differential signal based on the second differential signal.

23. The circuit board of claim 22, wherein the first dummy terminal and the second dummy terminal are electrically connected to each other.

24. The circuit board of claim 22, wherein
the first terminal group includes a plurality of the first dummy terminals in a plurality of spaces between the functional terminals of the first terminal group;
the second terminal group includes a plurality of the second dummy terminals in a plurality of spaces between the functional terminals of the second terminal group; and
at least one of the first dummy terminals and the second dummy terminals is connected to a ground wire of the circuit board.

25. The circuit board of claim 24, wherein each of the first dummy terminals is electrically connected to a corresponding one of the second dummy terminals.

26. The circuit board of claim 24, wherein the first dummy terminals and the second dummy terminals are electrically connected to each other.

27. The circuit board of claim 22, wherein
the first terminal group includes a plurality of the first dummy terminals in at least one space between the functional terminals of the first terminal group;
the second terminal group includes a plurality of the second dummy terminals in at least one space between the functional terminals of the second terminal group; and
each of the first dummy terminals is connected to a corresponding one of a plurality of ground wires of the circuit board.

28. The circuit board of claim 27, wherein each of the first dummy terminals is electrically connected to a corresponding one of the second dummy terminals.

29. A circuit board including an electronic component thereon, the electronic component comprising:
a first terminal group including a plurality of functional terminals provided along a first side of the electronic component;
a second terminal group including a plurality of functional terminals provided along a second side of the electronic component opposing the first side; and
an element that is connected to at least one of the functional terminals of the first terminal group and to at least one of the functional terminals of the second terminal group, wherein
a size of at least one space between the functional terminals of the first terminal group is such that a wire of the circuit board can pass therethrough;
a size of at least one space between the functional terminals of the second terminal group is such that a wire of the circuit board can pass therethrough; and the circuit board includes a ground wire that passes through the space of the first terminal group and the space of the second terminal group, wherein a first one of two functional terminals that are sandwiching therebetween at least one space between the functional terminals of the first terminal group and another functional terminal adjacent thereto receive a first differential signal;

a second one of the two functional terminals that are sandwiching therebetween at least one space between the functional terminals of the first terminal group and another functional terminal adjacent thereto receive a second differential signal;

a first one of two functional terminals that are sandwiching therebetween at least one space between the functional terminals of the second terminal group and another functional terminal adjacent thereto output a differential signal based on the first differential signal; and a second one of the two functional terminals that are sandwiching therebetween at least one space between the functional terminals of the second terminal group and another functional terminal adjacent thereto output a differential signal based on the second differential signal.

30. The circuit board of claim 29, wherein a size of a plurality of spaces between a plurality of functional terminals of the first terminal group is such that a wire of the circuit board can pass therethrough;

a size of a plurality of spaces between a plurality of functional terminals of the second terminal group is such that a wire of the circuit board can pass therethrough; and the circuit board includes a plurality of ground wires each passing through a corresponding one of the plurality of spaces of the first terminal group and a corresponding one of the plurality of spaces of the second terminal group.

* * * * *